(12) United States Patent
Vorbach

(10) Patent No.: US 9,703,538 B2
(45) Date of Patent: Jul. 11, 2017

(54) TOOL-LEVEL AND HARDWARE-LEVEL CODE OPTIMIZATION AND RESPECTIVE HARDWARE MODIFICATION

(75) Inventor: Martin Vorbach, Lingenfeld (DE)

(73) Assignee: Hyperion Core, Inc., Los Gatos, CA (US)

(*) Notice: Subject to any disclaimer, the term of this patent is extended or adjusted under 35 U.S.C. 154(b) by 4 days.

(21) Appl. No.: 14/124,636

(22) PCT Filed: Jun. 6, 2012

(86) PCT No.: PCT/EP2012/002419
§ 371 (c)(1),
(2), (4) Date: Jan. 13, 2014

(87) PCT Pub. No.: WO2012/167933
PCT Pub. Date: Dec. 13, 2012

(65) Prior Publication Data
US 2014/0310696 A1    Oct. 16, 2014

(30) Foreign Application Priority Data

Jun. 8, 2011  (EP) .................................... 11004667
Jun. 27, 2011 (EP) .................................... 11005196
(Continued)

(51) Int. Cl.
G06F 9/44       (2006.01)
G06F 9/45       (2006.01)
G06F 17/50      (2006.01)

(52) U.S. Cl.
CPC .............. *G06F 8/443* (2013.01); *G06F 8/447* (2013.01); *G06F 17/5045* (2013.01);
(Continued)

(58) Field of Classification Search
CPC ............... G06F 17/5045; G06F 17/505; G06F 17/5054; G06F 8/447; G06F 8/41;
(Continued)

(56) References Cited

U.S. PATENT DOCUMENTS 5,381,533 A     1/1995 Peleg et al.
5,717,394 A *   2/1998 Schwartz ............ H03M 7/4006
                                                341/107
(Continued)

FOREIGN PATENT DOCUMENTS

EP   11006698.2    9/2012
WO   20100142432   2/2010
(Continued)

OTHER PUBLICATIONS

Ricardo E. Gonzalez, Xtensa: A Configurable and Extensible Processor, IEEE 2000, [Retrieved on Feb. 24, 2017]. Retrieved from the internet: <URL: http://ieeexplore.ieee.org/stamp/stamp.jsp?arnumber=848473> 11 Pages (60-70).*
(Continued)

*Primary Examiner* — Thuy Dao
*Assistant Examiner* — Anibal Rivera
(74) *Attorney, Agent, or Firm* — IP Spring

(57) ABSTRACT

The present invention relates to a method for compiling high-level software code into hardware, transforming each instruction into a respective hardware block and using an execution control signal representing the program pointer for triggering the execution within each respective hardware block.

8 Claims, 12 Drawing Sheets

(30) Foreign Application Priority Data

Sep. 9, 2011 (EP) ..................................... 11007370
Dec. 16, 2011 (EP) ..................................... 11009912

(52) U.S. Cl.
CPC ........ *G06F 17/5054* (2013.01); *G06F 8/4434* (2013.01); *G06F 17/504* (2013.01)

(58) Field of Classification Search
CPC .... G06F 8/433; G06F 8/4432; G06F 9/30101; G06F 9/30134; G06F 9/3017; G06F 9/30174; G06F 9/3879; G06F 17/5022; G06F 8/51; G06F 8/34; G06F 8/44; G06F 8/4434; G06F 17/142; G06F 17/504; G06F 9/30149; G06F 11/2294; G06F 11/3676

See application file for complete search history.

(56) References Cited

U.S. PATENT DOCUMENTS

| | | | | |
|---|---|---|---|---|
| 5,809,290 A * | 9/1998 | DeRoo | G06F 7/68 | 713/500 |
| 6,161,162 A * | 12/2000 | DeRoo | G06F 9/30101 | 710/244 |
| 6,493,863 B1 * | 12/2002 | Hamada | G06F 17/5045 | 716/102 |
| 6,584,601 B1 * | 6/2003 | Kodosky | G06F 17/5054 | 715/771 |
| 6,608,638 B1 * | 8/2003 | Kodosky | G06F 11/2294 | 703/22 |
| 6,625,797 B1 * | 9/2003 | Edwards | G06F 8/447 | 702/108 |
| 6,990,555 B2 | 1/2006 | Vorbach | | |
| 7,028,107 B2 | 4/2006 | Vorbach | | |
| 7,036,036 B2 | 4/2006 | Vorbach | | |
| 7,152,227 B1 * | 12/2006 | Bloom | G06F 11/3676 | 714/E11.207 |
| 7,386,814 B1 * | 6/2008 | Stroomer | G06F 17/5045 | 703/14 |
| 7,392,489 B1 * | 6/2008 | Jackson | G06F 17/5045 | 716/102 |
| 7,533,362 B1 * | 5/2009 | Pritchard | G06F 17/5054 | 716/138 |
| 7,565,631 B1 * | 7/2009 | Banerjee | G06F 17/5045 | 716/103 |
| 7,574,688 B1 * | 8/2009 | Ward | G06F 17/505 | 716/104 |
| 7,613,858 B1 * | 11/2009 | Jackson | G06F 17/142 | 710/104 |
| 7,823,117 B1 | 10/2010 | Bennett | | |
| 2001/0034876 A1 * | 10/2001 | Panchul | G06F 17/5045 | 716/102 |
| 2002/0080174 A1 * | 6/2002 | Kodosky | G06F 8/34 | 715/762 |
| 2002/0100029 A1 * | 7/2002 | Bowen | G06F 8/41 | 717/140 |
| 2002/0124238 A1 * | 9/2002 | Metzgen | G06F 17/5045 | 717/136 |
| 2002/0147839 A1 * | 10/2002 | Boucher | H04L 29/06 | 709/238 |
| 2002/0161919 A1 * | 10/2002 | Boucher | H04L 29/06 | 709/238 |
| 2004/0015678 A1 * | 1/2004 | Strom | G06F 9/30101 | 712/202 |
| 2004/0019883 A1 * | 1/2004 | Banerjee | G06F 8/4434 | 717/152 |
| 2004/0098560 A1 * | 5/2004 | Storvik, II | G06F 12/063 | 711/209 |
| 2005/0209840 A1 * | 9/2005 | Baklashov | G06F 17/504 | 703/22 |
| 2005/0289485 A1 * | 12/2005 | Willis | G01B 31/318364 | 716/104 |
| 2006/0190233 A1 * | 8/2006 | Davis | G01R 31/31917 | 703/15 |
| 2007/0169033 A1 * | 7/2007 | Metzgen | | 717/140 |
| 2008/0141227 A1 * | 6/2008 | Waters | G06F 8/44 | 717/140 |
| 2010/0023729 A1 * | 1/2010 | Jackson | G06F 17/5045 | 712/36 |
| 2010/0131933 A1 * | 5/2010 | Kim | G06F 8/51 | 717/137 |
| 2010/0131934 A1 * | 5/2010 | Kim | G06F 17/5045 | 717/137 |
| 2011/0167225 A1 * | 7/2011 | Gloster | G06F 15/7885 | 711/147 |
| 2016/0179534 A1 * | 6/2016 | Xekalakis | G06F 9/30149 | 712/210 |
| 2016/0285472 A1 * | 9/2016 | Gopal | H03M 7/46 | |

FOREIGN PATENT DOCUMENTS

| | | |
|---|---|---|
| WO | 2010043401 | 4/2010 |
| WO | 2011079942 | 7/2011 |
| WO | 2012003997 | 1/2012 |

OTHER PUBLICATIONS

Rahul Razdan et al., A High-Performance Microarchitecture with Hardware-Programmable Functional Units, ACM 1994, [Retrieved on Feb. 24, 2017]. Retrieved from the internet: <URL: http://delivery.acm.org/10.1145/200000/192749/p172-razdan.pdf> 9 Pages (172-180).*

Videolan; webpage: http://www.videolan.org/developers/x264.html: VideoLAN; 2009; 2 pages.

ARM Architecture Reference Manual; Copyright; 1996-1998, 2000, 2004, 2005 ARM Limited.

Rotenberg, Eric; Trace Cache: a Low Latency Approach to High Bandwidth Instruction Fetching; Computer Science Dept. Univ. of Wisconsin, James E. Smith Dept. of Elec. and Comp. Engr. Univ. of Wisconsin; Copyright 1996 IEEE. Published in the Proceedings of the 29th Annual International Symposium on Microarchitecture, Dec. 2-4, 1996, Paris, France.

European Patent Office. International Search Report and Written Opinion for International Patent Application No. PCT/EP2012/002419. Feb. 7, 2013. 6 pages.

* cited by examiner

- ARM compatible
- 6 Load Units, capable of operating in parallel
- 4 Store Units, capable of operating in parallel
- 8 ALUs arranged in two columns
- Efficient network, providing:
  ▲ Top down dataflow
  ▲ Access to load/store units 1. Plain ARM code, executable on any ARM core Note: The registers bp[0]-[3] relate to any available register r[n].

2. Compiler generates predefined pattern:
   a) Loop header/footer
   b) Load/Store striding
   c) Conditional Store
   d) Code generator and Instruction Decoder/Placer using same algorithm for placing instructions 3. Instruction decoder detects pattern and issues code accordingly 4. Register dependencies are resolved and mapped to network

```
       mov    r1, r1              ; Switch on optimization loop:
a)     mov    r13, #0
       cmp    r13, #7
       beq    exit b)     ldr    r2, [bp0], #1       ; old_sm0
       ldr    r3, [bp0], #1       ; old_sm1
       ldr    r4, [bp1], #1       ; bm00
       add    r0, r2, r4
b)     ldr    r4, [bp1], #1       ; bm10
       add    r1, r3, r4
b)     ldr    r4, [bp1], #1       ; bm01
       add    r2, r2, r4
b)     ldr    r4, [bp1], #1       ; bm11
       add    r3, r3, r4 cmp    r0, r1
       movcc  r0, r1
b)     str    r0, [bp2], #1       ; new_sm0
c)     xor    r0, r0, r0          ; dec0 ...
       strbcc r0, [bp3], #1
       movcs  r0, #1
       strbcs r0, [bp3], #1       ; ... dec0 cmp    r2, r3
       movcc  r2, r3
b)     str    r2, [bp2], #1       ; new_sm1
c)     xor    r0, r0, r0          ; dec1 ...
       strbcc r0, [bp3], #1
       movcs  r0, #1
       strbcs r0, [bp3], #1       ; ... dec1 a)     add    r13, r13, #1
d)     b      loop exit:  mov    r0, r0              ; Switch off optimization
```

Fig. 6-2

In a preferred embodiment, the instruction set is enhanced with dedicated instructions, e.g.:

- lsuld(w/b), lsust(w/b): Memory instructions optimized for block transfers, including 2D/3D address generation, e.g. striding

- for, endfor: Loop instructions managing loop control

- Advanced (thumb) instructions in Loop-Acceleration-Mode increasing code density

```
lsuldw    r4, bp0 += ^1              ; old_sm0
lsuldw    r5, bp0 += ^1              ; old_sm1
lsuldw    r6, bp1 += 0 ^1*4          ; bm00
lsuldw    r7, bp1 += 1 ^1*4          ; bm10
lsuldw    r8, bp1 += 2 ^1*4          ; bm01
lsuldw    r9, bp1 += 3 ^1*4          ; bm11 lsustw    r0, bp2 += 0 ^2            ; new_sm0
lsustw    r2, bp2 += 1 ^2            ; new_sm1
lsustb    s0, bp3 += 0 ^2            ; dec0 (rss!)
lsustb    s1, bp3 += 1 ^2            ; dec1 (rss!)

for       0,<=7,+1 add       r0, r4, r6
add       r1, r5, r7
add       r2, r4, r8
add       r3, r5, r9 cmp       r0, r1
cmp       r2, r3
movle     r0, r1
movle     r2, r3 endfor
```

Fig. 6-7 ical illustration of example setup
TOOL-LEVEL AND HARDWARE-LEVEL CODE OPTIMIZATION AND RESPECTIVE HARDWARE MODIFICATION

PRIORITY

Priority is claimed to [1], [2], [3], [4], and [5].

REFERENCE TO COMPUTER PROGRAM LISTING APPENDIX AND INCORPORATION BY REFERENCE

A computer program listing appendix is included with this application on a compact disc (CD) (in duplicate). The entire contents of the program listing appendix are incorporated by reference into the patent for complete disclosure. The file name, date, and size in bytes for the files submitted on the compact disc are:

Program Listing 1: LISTING1.txt, May 5, 2017, 11 KB
Program Listing 2: LISTING2.txt, May 5, 2017, 14 KB

INTRODUCTION AND FIELD OF INVENTION

Tools for compiling high-level software code (e.g. C, C++, Fortran, etc) to hardware are known in the prior art. For example compilers from Handle-C (Celoxica), Impulse-C (Impulse Accelerated Technologies) are known.

Those tools focus on transforming high-level code into as optimal as possible hardware, e.g. in terms of area, power dissipation and/or performance.

Those tools have in common that the high-level code has to be modified for being transformable. Tools require hints (pragmas) to guide the compiler and/or support only a subset of the high-level language, or are even rather different but only use syntax similar to a known high-level language.

With smaller silicon geometries, area limitations are not particularly critical. With today's multi-core processor architectures even performance becomes less critical. However, power aspects become increasingly important and a driving factor for compiling high-level software code to hardware. Simultaneously time-to-market contradicts major code modifications as required in the state-of-the-art.

This patent describes a method and hardware architecture which allows compiling high-level software code to hardware without major modifications.

BRIEF DESCRIPTION OF DRAWINGS

FIG. 6-1 is a diagrammatic illustration of an example implementation of a processor core;

FIG. 6-2 is a diagrammatic illustration of an example loop in code to be processed by a processor;

FIG. 6-3 is a diagrammatic illustration of an example detection of loop information and setup and issuance thereof to a loop control unit;

FIG. 6-4 is a diagrammatic illustration of example setup and issuance of instructions to load units;

FIG. 6-5 is a diagrammatic illustration of example setup and issuance of instructions to store units;

FIG. 6-6 is a diagrammatic illustration of example issuance of instructions to Arithmetic Logic Units (ALUs); and FIG. 6-7 is a diagrammatic illustration of an example enhanced instruction set providing optimized instructions.

OVERVIEW AND INTRODUCTION

Figure 1:
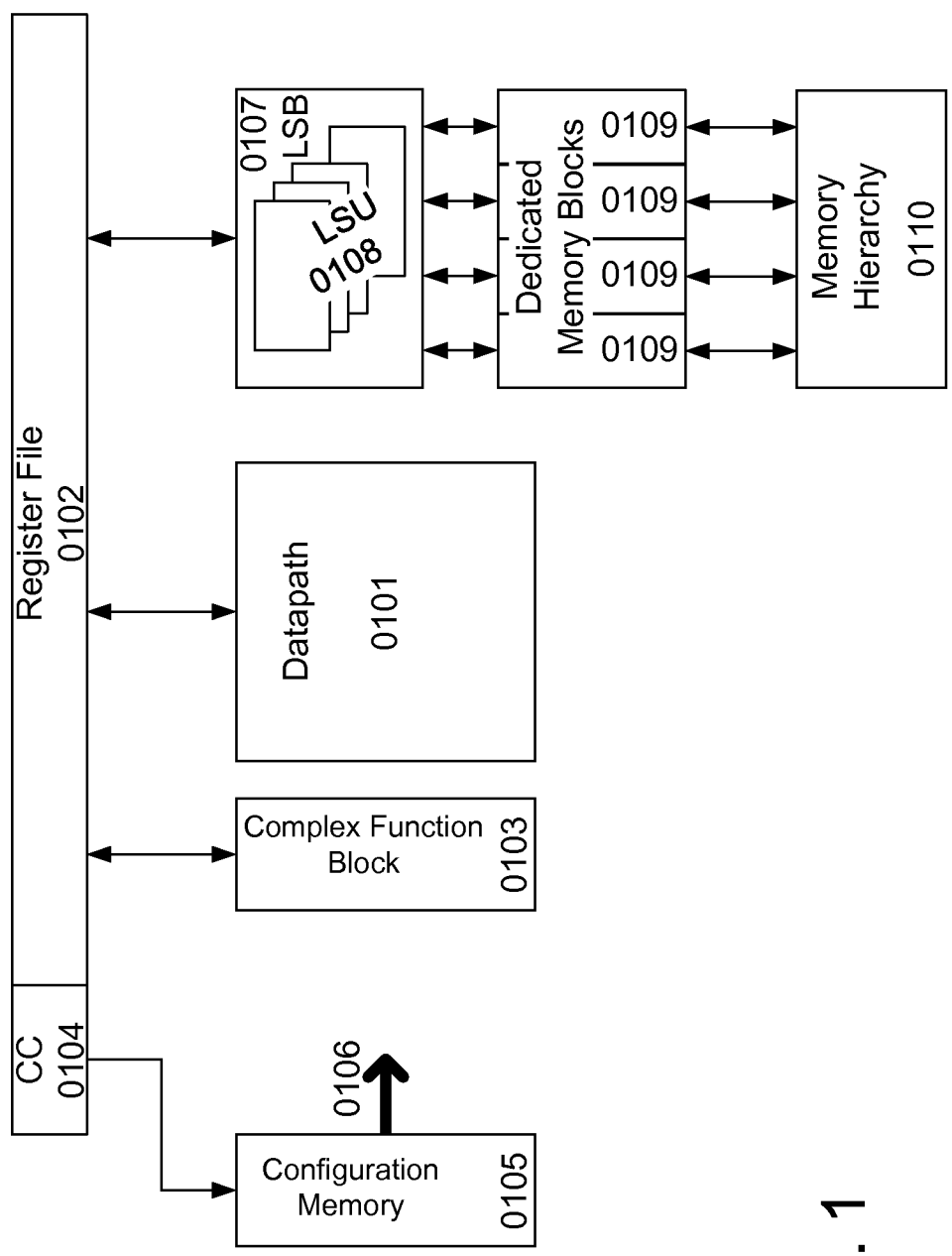
FIG. 1 is a diagrammatic illustration of an example reconfigurable hardware architecture including arithmetic logic units (ALUs)

A standard high-level compiler might compile high-level code into assembly code without any modifications. Note: Later in this patent are possible optimizations described which may make the code produced by the compiler more efficient.

Each resulting assembly instruction is then compiled into a hardware block, representing the instructions. The interface of the hardware block is defined by the source and target registers and possible status checking or generation of the assembly instruction.

In addition, each hardware block receives an execution signal (in_exec) for triggering operation and returns an execution signal (out_exec) if the operation has been performed and the result is produced.

A graph (code graphl.txt) representing the data transmission via the registers is generated by an analyser function (ANALYZER). The hardware blocks are chained respectively together by connecting the outputs and inputs of the blocks as defined by the register accesses of the assembly code.

Each block could operate synchronous and comprise respective registers at the signal inputs and/or output.

However, in a preferred embodiment, the blocks operate asynchronous for optimizing cycle time. Registers are inserted under e.g. at least one of the following exemplary conditions:

1. A block is complex and produces a long signal delay reduces the target frequency. This could be e.g. complex calculations, multipliers, etc.
2. A block depends on external timing and/or has to synchronize with external data senders and/or receivers.

The signals in_exec and out_exec connect the blocks and trigger their operation. By such, the in_exec/out_exec signal chain represents the program pointer of a real processor executing the assembly code.

Load/Store operations are implemented and stack accesses are performed as described in the assembly code. Therefore even recursive code can be processed.

In one embodiment, the generated hardware function comprising the assembly code might use dedicated memories for holding data local to the hardware function. For example preferably at least a local stack memory is implemented.

Blocks are grouped into modules. The contents of a module are defined by the execution graph of the assembly code. Some exemplary rules are:

1. Jump target address defines the beginning of a module. Jump target addresses can be detected by labels in the assembly code and/or target addresses of jump instructions. A jump target address is any jump target of any instruction (e.g. jmp; call; mov pc,r. (in ARM assembly)).
2. Jump instructions define the end of a module (e.g. jmp; call; mov pc,r_. (in ARM assembly)).

3. Saving the program counter (PC) into a link register (as e.g. known from ARM processors).

If the PC is saved with an offset, simultaneously the address PC+offset is defining the beginning of a new module.

Modules receive all register content according to the real processors register file as input and send all registers back as output. This may include any status and/or processor control and/or processor supervising registers.

Modules are preferably synchronous and register the input and/or output information. By such each module represents the register file of the real processor. It receives data from the internally grouped blocks and provides the data to other modules acting as register file.

If the signal delay within a module becomes too long to meet the target frequency, pipeline stages might be inserted in the module.

Modules are combined in a main routine (main). A call graph (which may comprise additional information) is generated by analysing the program pointer modifications in the assembly language. The main routine respectively has an input multiplexer in front of each module for receiving the input data from all potentially previously executed modules potentially jumping to/addressing the respective module. The selection of each of the multiplexers is controlled by the exec signals received from the previously executed module addressing the respective module.

Reconfigurable Core

The shown algorithm performs efficiently for small algorithms and functions (such as e.g. a FIR filter or a DCT). However, more complex algorithms, such as e.g. a complete H.264 video decoder will require an unacceptable amount of silicon area.

The solution to this problem is two-fold:
1. Using a reconfigurable hardware architecture, which is in line with the processing model of the compiler algorithm. The hardware platform is reused over time for various configurations, each representing a part of the algorithm to be processed.
2. Partitioning the compiled code into configuration, fitting and efficiently performing on the reconfigurable hardware.

FIG. 1 shows a respective exemplary reconfigurable architecture. The datapath block (DPB, 0101) comprising the ALUs and interconnection is preferably asynchronously implemented. It comprises an amount of ALU and interconnection resources, typical examples are 4×4, 6×4, or 6×6 arrays of ALUs.

The ALUs are capable performing functions according to the instructions set used by the compiler (or vice versa, the instruction set of the compiler is in accordance with the functions provided by the ALUs). In one embodiment, the required capabilities of the ALUs are analysed by the compiler at compile time and the ALUs are respectively designed in hardware. In one particular embodiment, the ALUs within the datapath (0101) may be heterogeneous and offer different functionality. The respective functions are defined by analysing the target algorithms, e.g. the compiler (or analysis tools such as profilers) could define on basis of one or a set of target algorithms which instructions are required, at which position(s) within the datapath and/or how frequently they are required be required (e.g. in only one ALU within the datapath, 2 ALUs or any other amount).

Preferably, the elements (e.g. ALUs) within the datapath operate asynchronously, so that all datapath operations are performed in a single clock cycle and then the next configuration is executed or the same configuration is repeated (e.g. for processing loops) once again. However, in some embodiments at least some pipelining might be supported, e.g. each or some of the ALUs comprise operand and/or result registers. In some embodiments some ALUs may comprise operand registers, while others comprise result registers and again others have no registers at all. Yet in other embodiments, pipeline stages may be drawn into the datapath at several physical stages not related to ALUs, e.g. in between the first and second half of the datapath, or after each quarter. The registers might be positioned in the interconnect structure.

Operand data is received from a register file (0102) and the results are written back to the register file.

It is typical for configurable architectures, that any element of a configurable array can send data to any other element. Particularly there is no strict limitation in which direction result data is send and from which direction operand data is received. Reference is made e.g. to Xilinx's Virtex-4, -5, -6, and -7 FPGA series, PACT's XPP architecture, IMEC's ADRES architecture and othet academic projects such as KressArray, Pleiades, PADDI, and DPGAs. This unlimited degree of freedom leads to various problems, e.g. the undefined timing and operation termination characteristic, which even includes potential timing loops in non-registered signal paths.

In the preferred implementation the datapath interconnection architecture of the ZZYX processors is implemented in its strictest variant, which is limited to a unidirectional topto-bottom data transmission. Reference is made to [4], e.g. FIG. 22. Also reference is made to [1], e.g. FIGS. 4, 27 and 27a. /1] and [4] are entirely incorporated by reference into this patent for full disclosure, claims of this patent may comprise features of [1] and [4]. In one embodiment data transmission in an unidirectional horizontal direction between elements (e.g. ALUs) is also permitted (see e.g. [4] FIG. 22, 2299). This limited capability of the datapath provides a variety of benefits: For example, the maximum signal delay is exactly predictable, no timing loops are possible, and the datapath complexity (and silicon area) is significantly reduced.

Particularly if the datapath operates asynchronously it is important to reduce the ALUs complexity to achieve an acceptable operating frequency. Therefore, complex time consuming instructions (e.g. multiplications) and/or multi-cycle instructions (e.g. division) are implemented in a dedicated Complex Function Block (CFB) (0103) separated from the datapath. The CFB performs such function(s) preferably within the cycle-time of the datapath (0101).

In one particular embodiment, the reconfigurable core might represent a standard processor or DSP, such as e.g. an ARM9, Intel x86 or a TI C64. The register file might represent exactly the registers as available in the respective processor. However, those register files are small, limiting the potential parallelism in the datapath. Therefore it is preferred using a larger register file, e.g. providing 32 to 256 registers depending on the amount of ALUs in the datapath. Analysis has shown, that for typical datapath sizes (e.g. 4×4, 6×4, or 6×6 arrays of ALUs) register files of about 32 registers (±16) are reasonable.

In one implementation of the software tool-chain (e.g. Ccompiler, linker, assembler, etc.) the compiler might use already a larger amount of registers and generate an incompatible binary with the standard processor and/or produce directly the configuration binary. In other implementations of the tool-chain a configuration-generator (CG) might analyse the register use and dependency and extend the amount of registers at that stage, e.g. by reassigning the registers or inserting virtual registers.

Typically the reconfigurable core comprises a Configuration Pointer (CP) or Configuration Counter (CC) register which is the respective substitution of the processors program pointer (PP) or program counter (PC). Within this patent we may use PC or PP, which are synonymous. The CC/CP (0104) points to the next configuration in a configuration memory (0105) to be configured and executed indicated by 0106.

The configuration memory might be a non-volatile memory, such as a ROM or Flash-ROM. In other embodiments it might be a RAM, particularly a SRAM. The RAM might be preloaded from another instance. Alternatively the RAM might operate similar to a Level-1 instruction cache (quasi a Level-1 configuration cache) and receive configuration from higher memory instances in the memory hierarchy, e.g. a Level-2 and/or Level-3 cache, or ultimately the system memory.

Figure 4:
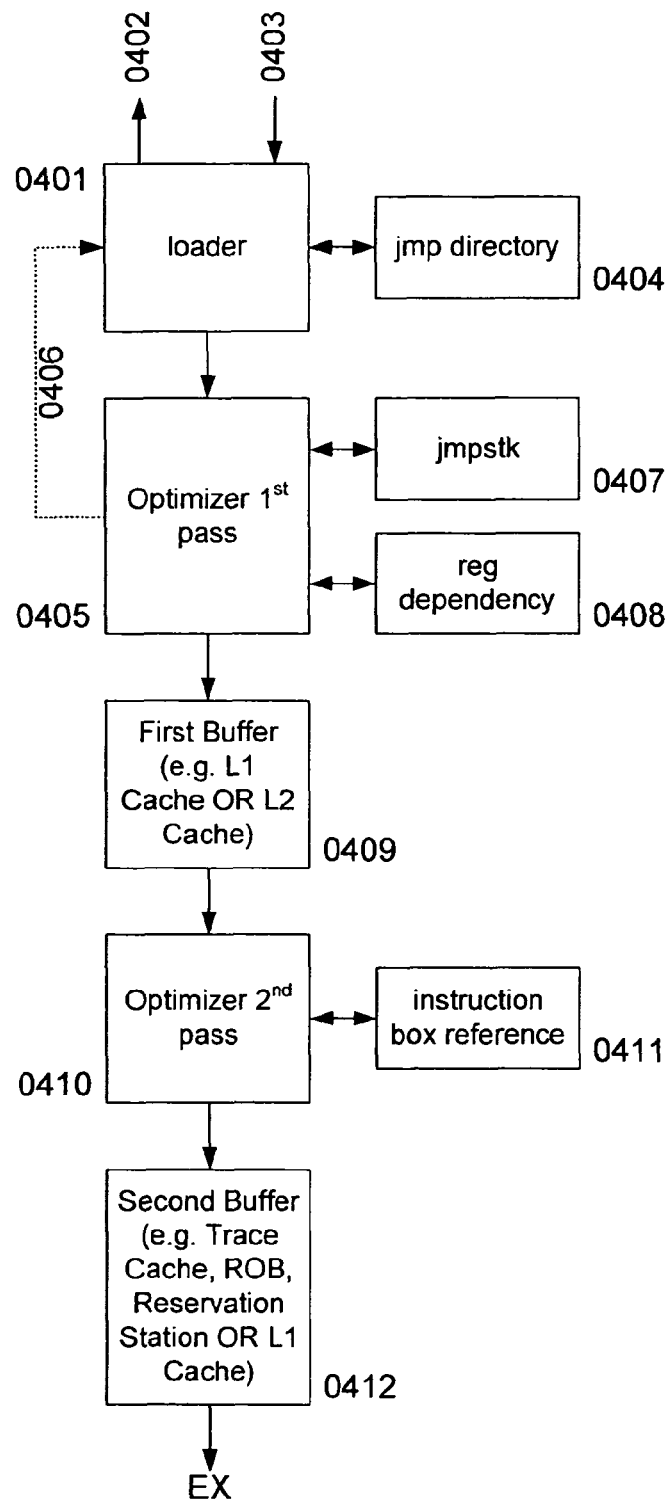
FIG. 4 is a diagrammatic illustration of an example structure provided in a processor.

It shall be expressively noted, that the invention is applicable on ZZYX processor cores and may be used as a compiler or directly implemented in the processor hardware e.g. as shown in FIG. 4.

Load/Store

In difference to reconfigurable architectures in the prior art, Load/Store Operations (LSO) are managed separately from other operations. The reasons are manifold, for example: LSO, particularly load operations, require a different timing model than other operations (e.g. ADD, SUBtract, ShiFT) as the latency of the memory access must be taken into account. Further LSO, particularly load operations, limit the achievable parallelism due to the bottleneck of accessing the memory.

Those reasons are some examples why in the prior art the programmer had to take specific measures to code and manage memory accesses and/or they significantly reduced the performance of the reconfigurable architecture. In the following an advanced architecture is described overcoming those limitations in conjunction with a novel Optimizer for compilers and/or low level tools to manage LSO more efficiently.

Particularly for timing reasons, LSO are not performed within the datapath, but in a dedicated separated Load/Store Block (LSB) (0107). The LSB has direct access to the register file.

Within the LSB a plurality of Load/Store Units (LSU) might be located, each LSU (0108) operating in parallel to the others on dedicated memory blocks (0109), supporting a plurality of data accesses in parallel. Some of the dedicated memories might be small scratch memories (e.g. Tightly-Coupled Memories (TCM)); some of them might be preloadable (so that e.g. constant data can loaded); some of them might be loaded from and off-loaded to the memory hierarchy (0110) (e.g. for supporting context switching), while others are only scratch dato which could be destroyed (e.g. in a context switch). Other dedicated memory might be Level-1 data caches exchanging data with the higher memory hierarch (0110). Preferably each of the Level-1 caches operates in a dedicated and exclusive memory address range, so that no coherence problems exist. Reference is made to [1], [2], [4] and [5] which are all entirely incorporated by reference into this patent for full disclosure and claims my comprise features of those references.

In a preferred embodiment the plurality of LSU is not only capable of accessing different memory ranges in parallel, but at least some of the LSU (preferably all of them) may support parallel accessing of data within a vicinity. This technology and benefits are described in detail in [5].

Conditional Execution

Processors tend to fine granular conditional execution, which frequently disturbs the linear increment of the program pointer (PC/PP). Theoretically a reconfigurable architecture could jump on the granularity of configurations (see e.g. [7] or [8]) or select parts of a configuration for execution (see e.g. [9]), if the tools are capable of generating respective code. Particularly for selecting parts of configurations for execution, it is required to replace the conditional jump operation by a conditional execution enable signal.

Some processors, e.g. ARM provide one conditional execution filed per instruction, which supports conditional execution based on one single state (e.g. one flag). More complex (e.g. nested) conditions are not supported. However, even in rather simple algorithms it is not sufficient to support only one single conditional level.

While processors, such as ARM, have to trade-off between performance and dense instruction set, configurable technologies tend to have slightly larger headroom and can afford some additional control bits for managing conditional execution in both the configuration data file and the actual hardware. Therefore, depending on the implementation 8 to 16 conditional levels are supported in the inventive core, future implementations may even support more levels.

Synchronisation

Configurable processors in the prior art either support no implicit synchronization (requiring explicit timing management by the software and/or programmer) as e.g. FPGAs, DPGAs and the like, or synchronization statemachines in each element (making timing entirely transparent to the programmer and/or software but requiring additional hardware) as e.g. PACT XPP.

In the inventive embodiment, synchronization occurs on a configuration level driven by the clock signal. Configurations have to terminate and complete data processing within the granularity of a clock cycle. Typically a configuration has to complete and terminate within one single clock cycles. However, depending on the complexity of the data path in asynchronous implementations, data may take longer to cross the datapath than a single clock cycle. It would certainly be possible to limit the datapath such that any operation will be completed within a clock cycles, and/or extend the compiler tool chain such that it ensures that the generated code meets the timing requirements.

Clock

In a preferred embodiment the processor hardware and the complier tool chain supports (maybe additionally) to configure the synchronization depending on the execution time (signal delay time) within the datapath. In this case at least for some configuration the number of clock cycles to complete dato processing is configurable. In typical implementations small ranges, such as 2 to 4 clock cycles is sufficient, while for datapaths supporting complex operations (e.g. floating point) the number of clock cycles should be configurable in a far larger scale, e.g. up to 128 clock cycles.

Description of a Code Example

For further explanation reference is made to the ARM Thumb assembly code (CODE1) in Appendix A of the present specification. This code is part of the x264 Encoder [6]. The listed code does not require much explanation as it is obvious for a person skilled in the art that the lines start with the line number, followed an instruction or a label. Instructions comprise a 32-bit binary displayed in hexadecimal notation. Although Thumb instruction set is used, the binary is already displayed in standard ARM non-Thumb binary code. Constant values are indicated by .word. For more detailed information reference is made to the ARM instruction set documentation.

The code in Appendix 1 (CODE1) is translated into a new format (CODE2) as shown in Program Listing 1 of the computer program listing appendix.

This translation may be performed at various levels, which may be claimed separately.

In one embodiment, the translation is already performed at compile time. In this case not necessarily a translation is performed, but the compiler back end may directly emit code according to CODE2. The respective optimization is then part of the compiler optimization passes and the back-end generates the respective code. The optimization passes may operate on the compiler internal data structures, such as e.g. the dependency graphs, DAGs, etc.

In another embodiment, the translation is performed in an intermediate step, analysing already compiled code and transforming it. This may happen in a separated tool run. Alternatively or additionally the operating system may perform the translation e.g. while installing the respective software, or while starting the respective software (e.g. by the loader). In yet another embodiment the translation is performed in hardware, e.g. within the micro-processor chip. As will be described, the translation may be performed at execution time. In one embodiment it is performed in front of and/or using an instruction cache and/or buffer structure.

In one embodiment, the optimization is done at different stages, for example:

At compile time the ideal instruction dependency might be analysed and the instructions respectively sorted, particularly in respect of the load/store instructions (LSI).

Possibly at install and/or load time, e.g. for adaption ideally to the systems memory and/or IO architecture.

At runtime within the processor, e.g. for expanding the binary from the limited instruction set architecture (ISA) to the processors hardware capabilities (e.g. a virtual register file).

The first characters of the CODE2 listing are for debugging purposes (<, –, >) and do not require detailed explanation. The line number is next, followed by a conditional control field comprising 16 levels of additional conditional execution levels. The respective instruction is executed depending on the conditional control settings and status flags provided by earlier executed instructions, such as compare instructions (cmp). It is followed by the binary and the instruction mnemonic. The register references are enhanced with dependency information, an underscore followed by the address of the register source, or in case of a register target followed by the current address. The mnemonic is enhanced with conditional and flag information. For each conditional level the flag source is provided, indicated by "f_" followed by the source's address. Instructions generating flags are enhanced with "c_" and the current address, indicating the conditional information (flags) are provided.

Instruction using a register (e.g. as base address), modifying it and writing back a different value, are enhanced with the full register access sequence: For example push {r3, r4, r5, r6, r7, lr} uses the stack pointer (r13) as base address for the data transfer and returns the modified stack point to the register. Consequently the instruction is replaced by push /t13_007c, s13_0000/!, {s3_0000, s4_0000, s5_0000, s6_0000, s7_0000, s14_0000} for indicating all register transactions requiring for the optimization.

It shall be mentioned here, that the reference _0000 indicates that the registers of the function (callee) are set prior to entering the function by the calling routine (caller).

The code (CODE2) is partitioned into boxes (BOX n). All instructions within a box can execute simultaneously. In this embodiment an asynchronous datapath is implemented, supporting a plurality of instructions, even depending ones, to be issued in one clock cycles and executed in one clock cycle. Load/Store instructions cannot be executed asynchronously due to the rather long delays and/or the pipelined nature of the memory subsystem, e.g. even a level-1 cache access may require a plurality of clock cycles. Therefore depending Load/Store instructions are placed in different boxes.

In one embodiment a box comprises a sequence of instructions which might execute concurrently and asynchronously. Instructions might depend on other instructions, e.g. a result of an instruction might feed operands of one or more subsequent instructions. Instructions within a box might execute conditionally, e.g. as known from the ARM instruction set (see condition field of ARM instructions, e.g. [13]). A jump (or call) or conditional jump (or call) defines the end of a box and is usually the last instruction to be placed into a box.

In another embodiment the instructions within the box must be independent, i.e. a result of an instruction might not feed operands of one or more subsequent instructions.

In one embodiment a jump target (instruction to be jumped to by a jump or conditional jump instruction) must be located at the very beginning of a box, i.e. the first instruction. Only one jump target is supported per box.

In another embodiment multiple jump targets might be allowed within a box which can even be placed at random position. In this case the hardware must decode the instruction pointer PP delivered by the previous box initiating the jump into the box and omit all instructions prior to the instruction pointer PP.

In a preferred embodiment, all instructions of a box have the same timing, e.g. perform in a single clock cycle, two clock cycles, . . . n clock cycles. Also instructions with the same timing model might be grouped, e.g. load instructions which have to wait for the incoming data, or store instructions which depend on the availability of write access to memory. Those boxes trigger all individual instructions once for a single execution, individual instructions might perform and terminate independently of others. The box is only left, i.e. execution continued with the next subsequent box, if each individual instruction has been performed and terminated.

A box is left with a pointer to the next box to be executed, preferably this pointer is the instruction pointer PP. For further details see FIG. 5.

Load/Store instructions (LSI) are grouped. In an ideal embodiment of the Load/Store Units (LSU) all or at least some of the Load/Store instructions (LSI) can be executed simultaneously. Theoretically all LSI within a box can be executed in parallel, however the capabilities of the LSU may limit the achievable concurrency.

It is therefore preferred, that a plurality of memories is implemented, each memory operating on a different address range. Reference is made to [1] and [2], describing respective memory hierarchies. It shall be noted again, that these patents are entirely incorporated by reference for full disclosure and respective claims may use features described in them.

In an even more preferred embodiment a plurality of addresses are accessible simultaneously within at least some of the single memories. Reference is made to [5], describing a respective memory. It shall be noted again, that this patent is entirely incorporated by reference for full disclosure and respective claims may use features described in it.

Load/Store instructions (LSI) and other datapath instructions may be placed into the same box. In this case no dependency between the Load/Store instructions (LSI) and any other datapath instruction is allowed within the same box.

The Optimizer

Various implementation of a respective optimizer algorithm are possible. For example may the implementation depend on the environment in which the algorithm is used.

An exemplary optimizer algorithm is described which operates on non-optimized binaries already generated by a compiler. The algorithm might be used in a separated tool optimizing code or by an operating system optimizing code while loading or installing it.

A slightly modified embodiment might be implemented in hardware, e.g. in a micro-processor.

Other optimizer algorithms might operate on the Data-Flow-Graph (DFG) and Control-Flow-Graph (CFG) within a compiler and use Dependency Graphs and analysis for scheduling the instructions.

Figure 2:
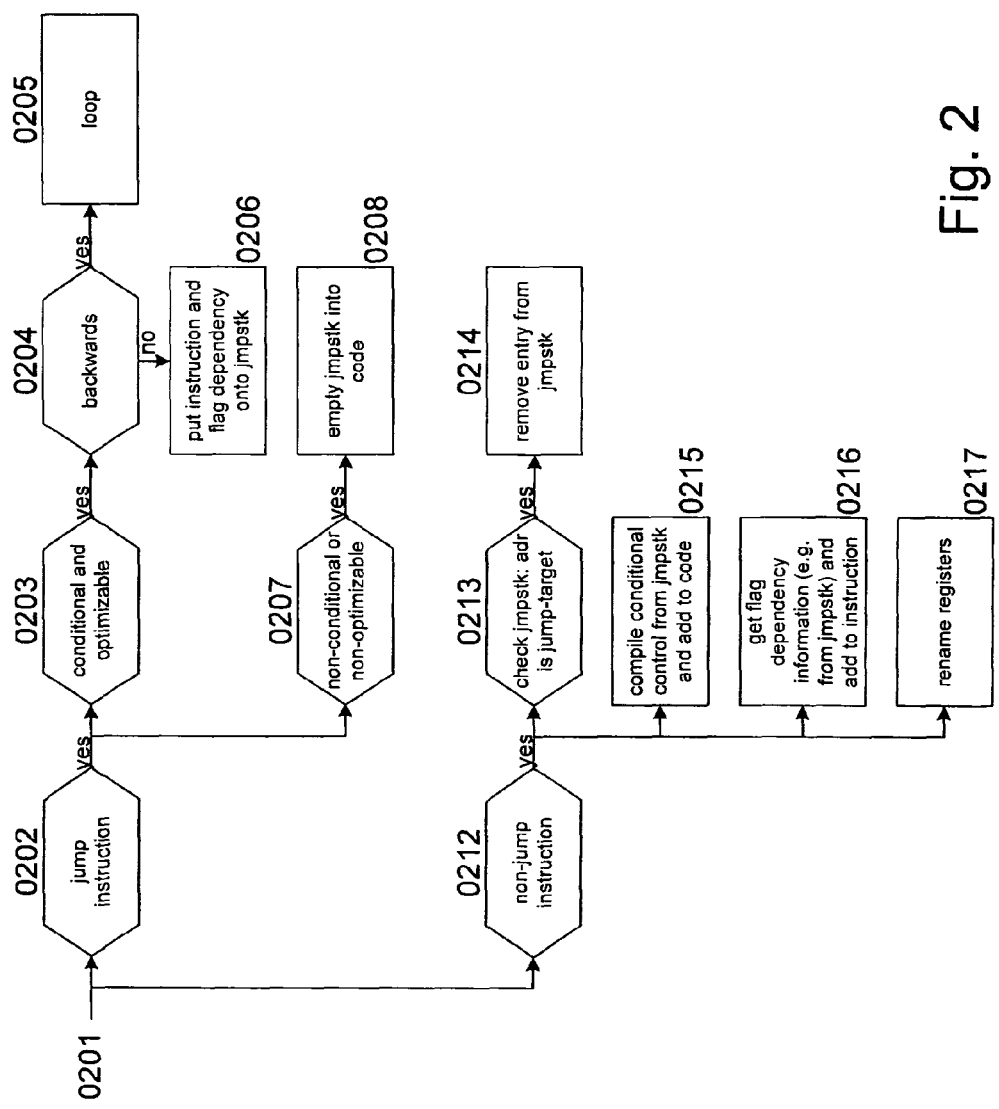
FIG. 2 is a diagrammatic illustration of an example first pass of an optimizer algorithm.

The exemplary algorithm operates in two passes:

The first pass is outlined in FIG. 2. The optimizer pass (OP1) moves linearly through the binary, from the first to the last instruction. Each instruction is analyzed (0201).

OP1-1. If the instruction is a jump instruction (0202), the type of jump instruction is checked.
   a. If it is a conditional and optimizable instruction (0203), it is checked whether the jump points backwards (0204) in the code to an earlier instruction.
      i. In this case a loop is detected and respectively marked (0205).
      ii. If not, a conditional code section has been detected. The jump instruction is removed from the code, but a respective entry with all information of the jump instruction, including the condition for its execution, is put (0206) onto a jump-stack (jmpstk) comprising all information of conditional and optimizable jump instructions in the order of their occurrence. Additionally flag dependency data is added to the jmpstk indicating from which flag the conditional jump depends on and which instruction generates the respective flag.
   b. If it is a non-conditional or non-optimizable instruction (0207) (in this simple exemplary embodiment of the optimizer) all jumps still present on the jmpstk (see below) are written back into the code (0208) in stack order, i.e. from top to bottom.

OP1-2. If the instruction is not a jump instruction (0212):
   a. It is checked if the address is a target address of a jump instruction by evaluating the jmpstk.
      i. If so, the respective entry/entries is/are removed from the jmpstk.
   b. The jmpstk is evaluated and conditional control information added (0215). As conditional jump instructions might be removed from the code in 0206, it is necessary to add the respective conditional execution control code to the instruction.
   c. Flag dependency information is collected from the jmpstk and added to the instruction (0216).
   d. Registers are renamed (0217).

Figure 3:
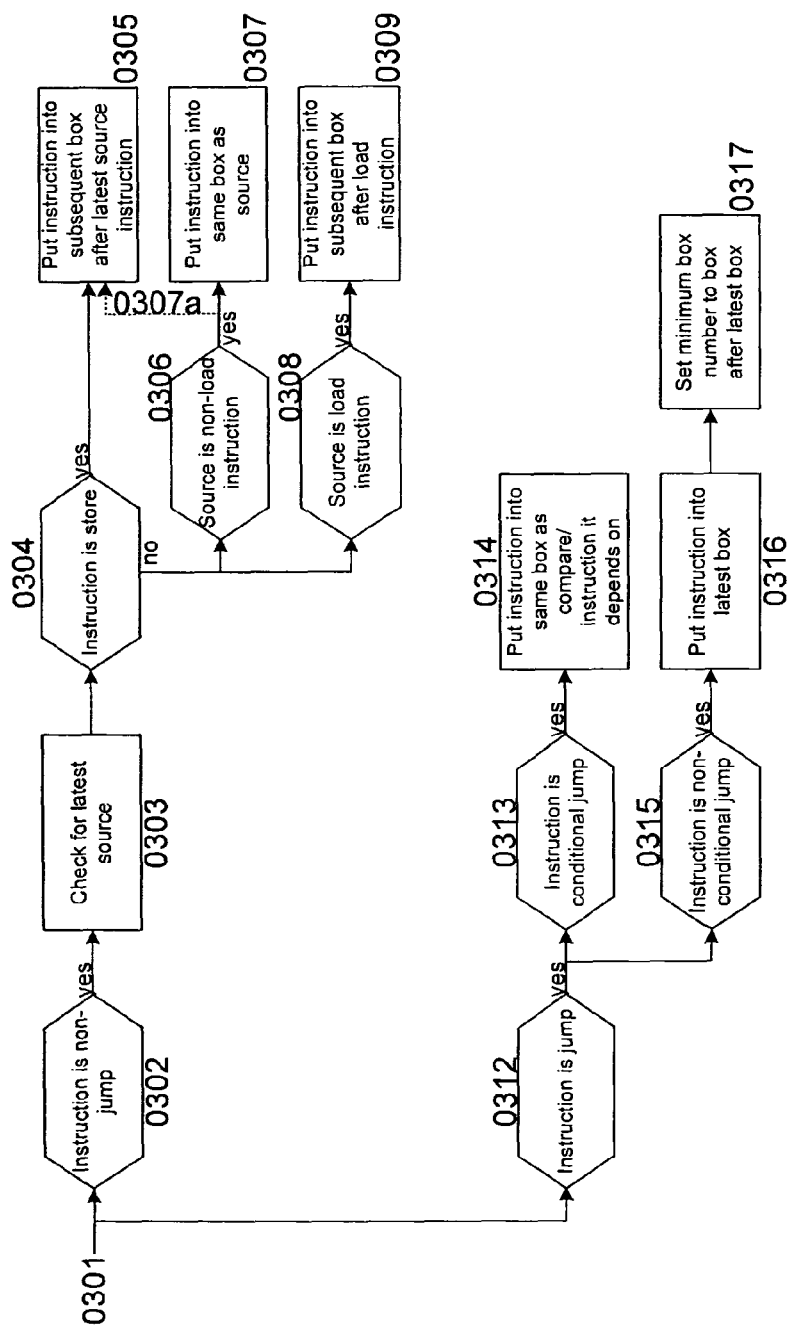
FIG. 3 is a diagrammatic illustration of an example second pass of an optimizer algorithm.

The second pass is shown in FIG. 3. The optimizer pass (OP2) moves linearly through the enhanced binary data produced by the first pass. Each instruction is analyzed (0301).

OP2-1. If the current instruction is not a jump instructtion (0302), the latest source of the instruction is detected based on the register reference information generated by the first pass. The information of the latest (latest in terms of last recently produced) source is retrieved.
   a. If the current instruction is a store instruction (0304) it is placed into the next subsequent box after the box in which the latest (latest in terms of last recently produced) source instruction is placed (0305); else
      i. If the current instruction's latest (latest in terms of last recently produced) source is a nonload instruction (0306), the current instruction can be placed into the same box as the source instruction (0307). (However, if the current instruction is a multi-cycle instruction (such as e.g. multiplication, division, load, etc.) it is also preferably placed into the next subsequent box after the box in which the latest (latest in terms of last recently produced) source instruction is placed (see dotted line 0307a).)
      ii. If the current instruction's latest (latest in terms of last recently produced) source is a load instruction (0308), the current instruction is placed into the next subsequent box after the box in which the latest (latest in terms of last recently produced) source instruction is placed (0309).

OP2-2. If the current instruction is a jump instruction (0312):
   a. If the current instruction is a conditional jump (0313) it is placed into the same box as the instruction the condition depends on (0314), e.g. a compare or flag generating arithmetic instruction. Conditional jumps can be handled that way and moved within the box structure as the code is controlled by the conditional control information added by 0215.
   b. If the current instruction is a non-conditional jump (0315) it is placed in the last available box (0316). With that all boxes (prior to and the last) are closed (0317). Subsequent instructions cannot be moved into one of those boxes as this would destroy the correct execution of the code. Therefore subsequent instructions are moved into a new set of boxes beginning after the last box.

An exemplary respective algorithm operating on assembly code (e.g. CODE1) is shown in Program Listing 2 of the computer program listing appendix. It produces assembly code again (e.g. CODE2) and is written in Perl for easy understanding.

Exemplary Transformation

Either high level code (e.g. C, C++, Fortran, is compiled to assembly code, or plain assembly code is directly taken as an input. Any compiler for a given existing processor architecture can be used.

The assembly code is reordered and grouped into boxes by a hardware generator software tool as described. Each box comprises the respective instructions. Each box has one or more entry points. If at runtime a box is enabled, the correct entry point is chosen depending on program pointer PP provided when enabling the box. PP is decoded and selects the according instruction as entry point.

Figure 5:
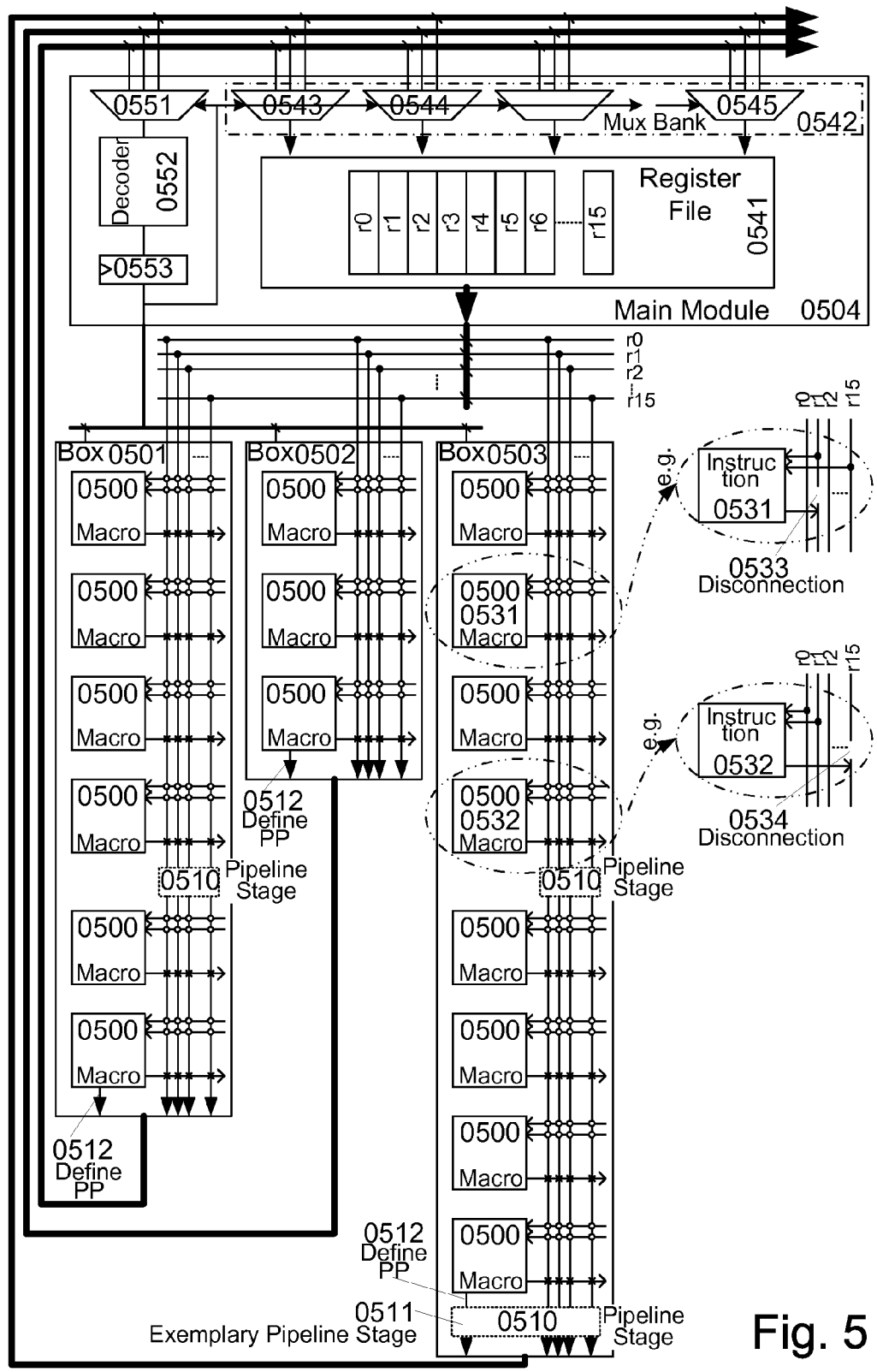
FIG. 5 is a diagrammatic illustration of an example hardware module generated by a hardware generator tool from source assembly code.

FIG. 5 shows a hardware module generated by a hardware generator tool from source assembly code. The hardware module is typically emitted by the hardware generator tool in a hardware description language (e.g. Verilog, VHDL), e.g. either as synthesizable code or a gate netlist. The hardware module is a hardware representation of the software source code.

A hardware library provides hardware macros for all used instructions, e.g. for an add instruction a hardware adder is provided, for a load instruction a hardware load unit, etc.

For each instruction the respective hardware macro is instantiated and placed into the respective box's hardware module by the hardware generator software tool.

FIG. 5 shows 3 boxes (0501, 0502, 0503). Each box comprises an instantiated macro (0500) for each of the instructions of the box's assembly code. The instructions respectively macros are placed and interconnected in order of their execution sequence. For each register of the register file (for example data registers, address registers, control registers (such as e.g. status), and preferably the program pointer PP), a respective bus is implemented within the box. Operand data is taken from the buses (indicated by 'o') and result data is put onto the buses (indicated by 'x') according to the source and target registers of each respective instruction. Result data might either be directly connected to the bus, i.e. drive the bus for all subsequent instructions and the bus connection to previous instructions is respectively disconnected (see e.g. 0533, 0534), or inserted into the bus via a multiplexer selecting result data from the respective macro instead the previous bus information.

For example instruction 0531 receives operand data from register buses r1 and r15 and puts its result back onto register bus r1; instruction 0532 receives operand data from register buses r0 and r1 and puts its result back onto register bus r15.

The register buses in the box modules may contain pipeline stages (0510) for reducing the overall delay. The insertion of pipeline registers depends on the application's target clock frequency and latency requirements. Pipeline registers are preferably automatically inserted by the hardware generator tool (e.g. 0510).

The register file buses are fed by the register file (0541) located in the main module (0504). In alternative embodiments, the register file might not be located in the main module, but formed by pipeline registers in the box modules, e.g. 0511. Respectively pipeline registers might be inserted directly at the output of each box module (as exemplary shown by 0511).

The last instruction of a box typically defines the program pointer PP (0512) to continue with. This is particularly true if the last instruction is a conditional or unconditional jump (or call) instruction. This program pointer is transmitted to the main module for selecting the next subsequent box for execution. If a pipeline register exists at the exit of the box (e.g. 0511), the program pointer is registered too.

All result data from the boxes is fed to the main module, in a one embodiment one bus for each for each register and box. For writing back the result data of each of the boxes into the register file, a multiplexer bank (0542) in the main module (0504) selects the source bus for each register of the register file (0541) according to the currently active box, e.g. multiplexer 0543 for register r0, 0544 for register r1, and 0545 for r15.

Multiplexer 0551 selects the target program point (i.e. the address of the next instruction to be executed) (0512) according to the currently active box. The target program pointer is decoded by a decoder (0552) and stored in a register (0553). The stored information enables the box comprising the respective instruction according to the target program pointer of the current execution in the next execution cycle (e.g. clock cycle) and selects the result data and target program pointer of the next execution via the multiplexer bank 0542 and register 0551 respectively.

In addition to the connectivity of the boxes shown in FIG. 5, other buses might be present, e.g. for interfacing to memory (such as caches, tightly coupled memory, etc) and/or peripherals.

Depopulated Buses

Register buses not used within a box, might be eliminated within a box for reducing the hardware overhead. The respective registers of the register file (0541) are disabled when writing back result data from the respective box module.

In-Line Conditional Execution

Conditional execution is supported within boxes, if no branching is required. The ARM instruction set, for example, supports respective operations by the condition field of at least some instructions defining, see [11]. The respective status information is transported via the box internal buses, similar as the register data. It shall be explicitly mentioned, that the register file 0541 also comprises a status register, with a multiplexer selecting the source box—similar as the data registers. A conditionally executed macro (0500) evaluates the status information from the status bus according to its condition setting (e.g. the condition field in the ARM instruction set, see [11]). If the condition is met, the results data of the macro is written onto the respective bus according to the target register. The result data is conditionally written to the bus via a multiplexer in the bus (e.g. in place of 0534 or 0533 respectively). Alternatively the respective bus data is by passed via a multiplexer inside the macro, in which case the target bus becomes an additional input to the macro just for providing the data to be bypassed in case the condition is not met.

Effect of Managing the Program Pointer PP

The active management of the PP by transferring between the boxes and the main module and in some embodiments even within boxes allows for flexible processing of jumps. Depending on the implementation even for jump tables and runtime calculated address values.

In some embodiments boxes (e.g. 0501, 0502, 0503) and/or macros (e.g. 0500) might even compare their code address range and/or code address to the currently transmitted program pointer PP and become active when the current program pointer meets the boxes and/or macros set point.

Applicability on Processor Hardware

The inventive optimizer is applicable on processors by integrating it into the processor hardware. The optimizer reduces the complexity and power dissipation of processors, particularly Out-of-Order processors, as for example large and power consuming Reorder Buffers are replaced by the inventive technology.

Reference is made to FIG. 4. An instruction loader generates addresses (0402) to the instruction memory hierarchy (e.g. the Level-2 cache and/or Level-3 cache and/or system main memory) for fetching instructions (0403) to be executed. The loader is driven by the program pointer and loads instructions ahead of their execution.

In a preferred embodiment the optimizer of FIG. 4 operates on complete routines and/or functions for best optimization results. The loader must ensure that a complete routine or function is loaded for optimization. For example a function shall be defined as a code block starting with the entry (first address of a routine) and ending with a return (ret) instruction. Depending on the processor implementation and its specific instruction set, other conventions and implementations (particularly of the instruction set) are possible.

In a very basic implementation the loader starts loading instructions with the first address of code not loaded yet and/or not being present in any of the code buffers and/or caches downstream the loader, i.e. between the loader and the execution units of the processor, until the first return instruction leaving the routine. However, it cannot be guaranteed that the first return instruction is the only one leaving the routine. Due to conditional execution other return instructions may exist, so that the first found return instruction might not be a sufficient criterion.

In an ideal implementation it must be ensured that the complete software routine and/or function is loaded. Various implementations are possible, for example:

a) The loader uses a jump directory (0404) in which each target address of detected jump instructions are stored and performs the following steps:

LD1. Whenever a target address is reached and read by the loader it is removed from the jump directory.

LD2. If a return instruction is detected, but the jump directory is not empty obviously more code must exist belonging to the function. In that case the loader continues loading instructions.

LD3. If a return instruction is detected and the jump directory is empty no more code exists belonging to the function. The loader stops loading code.

LD4. If a non-conditional jump backwards in the code is detected and the jump directory is empty no more code exists belonging to the function. The loader stops loading code.

b) The optimizer (0405) performs the steps of a) and instructs the loader respectively (0406). It might use a respectively amended jmpstk (0407) to perform the functions of the jump directory.

The loader forwards the loaded instructions to a first optimizer pass (0405) (e.g. OP1 as described above). The optimizer pass uses a stack memory (0407) to implement the jmpstk.

In a register file (0408) for each register the latest source instruction is stored.

The results of first optimizer pass are written into a buffer memory (0409). Various embodiments are possible, for example:

In one embodiment, the buffer memory is a processor internal buffer. The loader gets the instructions from a Level-1 Cache.

In another embodiment, the loader and first optimizer pass are located in front of the Level-1 Instruction Cache. The loader gets the instructions from a Level-2 Cache. The Level-1 Instruction Cache is used as buffer memory 0409.

The second optimizer pass (0410) gets the instructions from the buffer memory (0409) and writes the optimized instructions into a second buffer memory (0412). The second optimizer pass might use an instruction box reference memory (0411) for looking up the box in which a specific instruction has been placed. The instruction's address is translated into a memory reference, under which the identification can be found of the box into which the respective instruction has been placed.

The Execution Units (EX) receive the instructions (or microcode at this stage) from the second buffer.

The second buffer can be located at various positions, depending on the implementation. For example:

In one embodiment, the second buffer is the Level-1 Instruction Cache, in this case, the first buffer might be a Level-2 Instruction Cache.

In another embodiment, the second buffer is a Trace Cache replacing and/or extending the functionality of the Trace Cache. During the second optimizer pass instructions are translated into microcode and possibly fused or split. For details of the Trace Cache, reference is made to the Pentium-4 Processor, particularly to [10], [11] and [12]. [10], [11] and [12] are entirely incorporated by reference into this patent for full disclosure, claims of this patent may comprise features of [10], [11] and [12]. For further details on micro-10 code fusion and splitting, particularly in conjunction with the inventive processor technology, reference is made to [4] and [5].

In yet another embodiment, the second buffer might be in the position of a ReOrder Buffer (ROB), replacing and/or extending its functionality. Respectively the first buffer might be a Trace Cache (if implemented) or a Level-1 Instruction Cache.

In yet another embodiment, the second buffer might be replacing and/or extending the Reservation Stations of a processor.

It shall be noted that FIG. 4 is based on the assumption that the exemplary 2 pass optimizer of FIG. 2 and FIG. 3 is implemented. Depending on the algorithm, one-pass or multi-pass (with 2 or more passes) optimizers might be used. Respectively and obvious for one skilled in the art the block diagram of FIG. 4 is modified. For example a one-pass optimizer might not need the buffer 0409, while multi-pass optimizers might have one buffer implemented between each of the passes.

Ideally the structure according to FIG. 4 reads ahead of the Program Pointer. The capability of following the program flow by analyzing the potential jump targets allows for intelligent prefetching of code. For example a complete function can be prefetched without further consideration (e.g. by the programmer and/or compiler and/or other tools). The inventive steps not only allow that the complete function or routine is prefetched, it also stops once the function or routine has been loaded without prefetching subsequent memory locations (e.g. other parts of the code) and thus wasting energy and memory bandwidth.

In one advanced embodiment, function calls within the prefetched function or routine might be detected. For example call instructions could be placed in a dedicated call stack memory e.g. by the loader or optimizer or respectively marked in the jmp directory (0404) and/or jmpstk (0407). Preferably after the complete function has been (pre-)fetched, the called functions are prefetched, so that they are available prior to calling them. It might be beneficial to priorized the prefetching, e.g. by prefetching functions early in the code and/or those with are non-conditionally called first.

Then conditionally called functions are fetched, while the conditions might be evaluated for the likelihood of their execution. Several evaluation methods are possible, for example:

a) based on statistics (e.g. stored together with the binary);

b) jump instructions including a likelihood indicator of their execution (e.g. 2 bits: 00—unlikely, 01—rather unlikely, 10—rather likely, 11—likely);

c) based on how the condition is expressed in the binary: The condition false path might be defined as likely, while the condition true path might be defined as unlikely (or vice versa);

d) a dummy instruction located before the (function call) instruction indicating the likelihood of the execution of the call, the instruction might be only evaluated by the loader/optimizer and removed afterwards.

Obviously the evaluations might also be very useful for other conditional jumps (other than calls) for providing optimization information to the processor, e.g. for loop optimization and/or speculative execution.

Known from [5], which is expressively incorporated by reference, are optimizations for managing constant data. In addition to the optimizations discussed in [5], processors having buffers for storing instructions which are frequently accessed may replace instructions loading constant data once the constant data has been loaded from memory with the constant data itself. If the processor comprises a Trace Cache as previously described, in one preferred embodiment, the constant data is written into the trace cache replacing the original instruction. In other embodiments, instructions in the Reorder Buffer and/or Reservation Station might be replaced with the constant data. By replacing the load instruction with the actual data, the instruction will not be executed anymore and therefore the respective time and energy is saved.

Is shall also be further noted, particularly referring to [5], that some processor instruction sets support loading data from a Program Counter (PC) relative address, e.g. ARM's LDR <Rd>, [PC, #<immed8>*4]. As typically data within the code segment (relative to the program pointer) is generated at compile and/or link time, such data is constant. Therefore pc relative load instructions might be recognized and/or used as dedicated load-constant instructions (e.g. ldc).

PRIOR ART

Trace Caches are known in the prior art, which store a transformed representation of original binary code. Reference is made to the Pentium-4 Processor, particularly to [10], [11] and [12]. [10], [11] and [12] are entirely incorporated by reference into this patent for full disclosure, claims of this patent may comprise features of [10], [11] and [12]. However Trace Caches are significantly different from this invention. Some major differences are:
1. Trace Caches store decoded instructions in microcode format. The code stored in Trace Caches is not optimized, but solely decoded (transformed) from a dense binary opcode representation into a large vector controlling the processor hardware.
   The inventive caches store modified code, in which e.g. the sequence of instructions is rearranged, and/or source and/or target registers are changed (even replaced by Execution Units, e.g. ALUs in the ALU-Block of a ZZYX processor), and/or instructions are combined and/or grouped to form code blocks (e.g. Catenas, reference is made to [1] and [3], both incorporated by reference into this patent for full disclosure, claims of this patent may comprise features from [1] and [3]) which are executed and/or scheduled simultaneously. The optimizer routine may also perform completely different or additional optimizations of the binary which results are stored in the inventilw cache.
2. Trace Caches store only code which has been already executed. Only code which have been previously addressed by the processor's program pointer, respectively fetched and decoded are present in a Trace Cache. This inventtion, however, operates (timely and locally) in front of the program pointer. While it is under control of the program pointer (e.g. jumps affect the next code range to be fetched, optimized and stored) the loading and optimization of a code is done ahead of addressing the code by the program pointer. The inventive caches comprise codes which have not been addressed by the processsor's program pointer yet.

While Trace Caches store only code which has already been executed, the inventive caches store complete code blocks, e.g. subroutines, functions, loops, inner loops etc.

Exemplary Embodiment

Figures 1, 6:
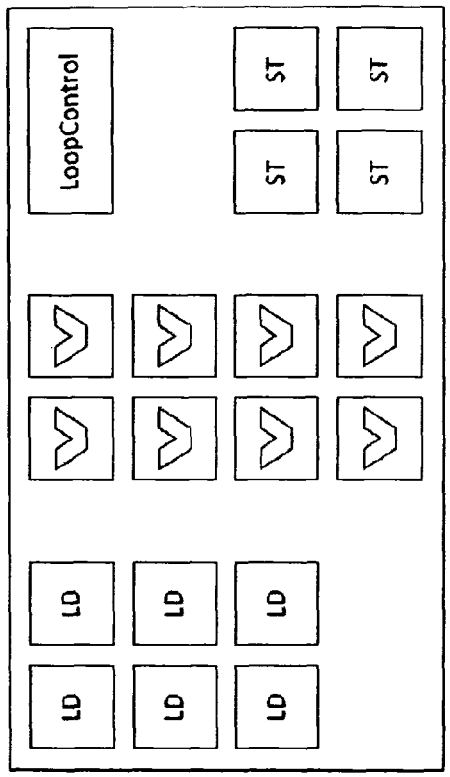
Figures 3, 6:
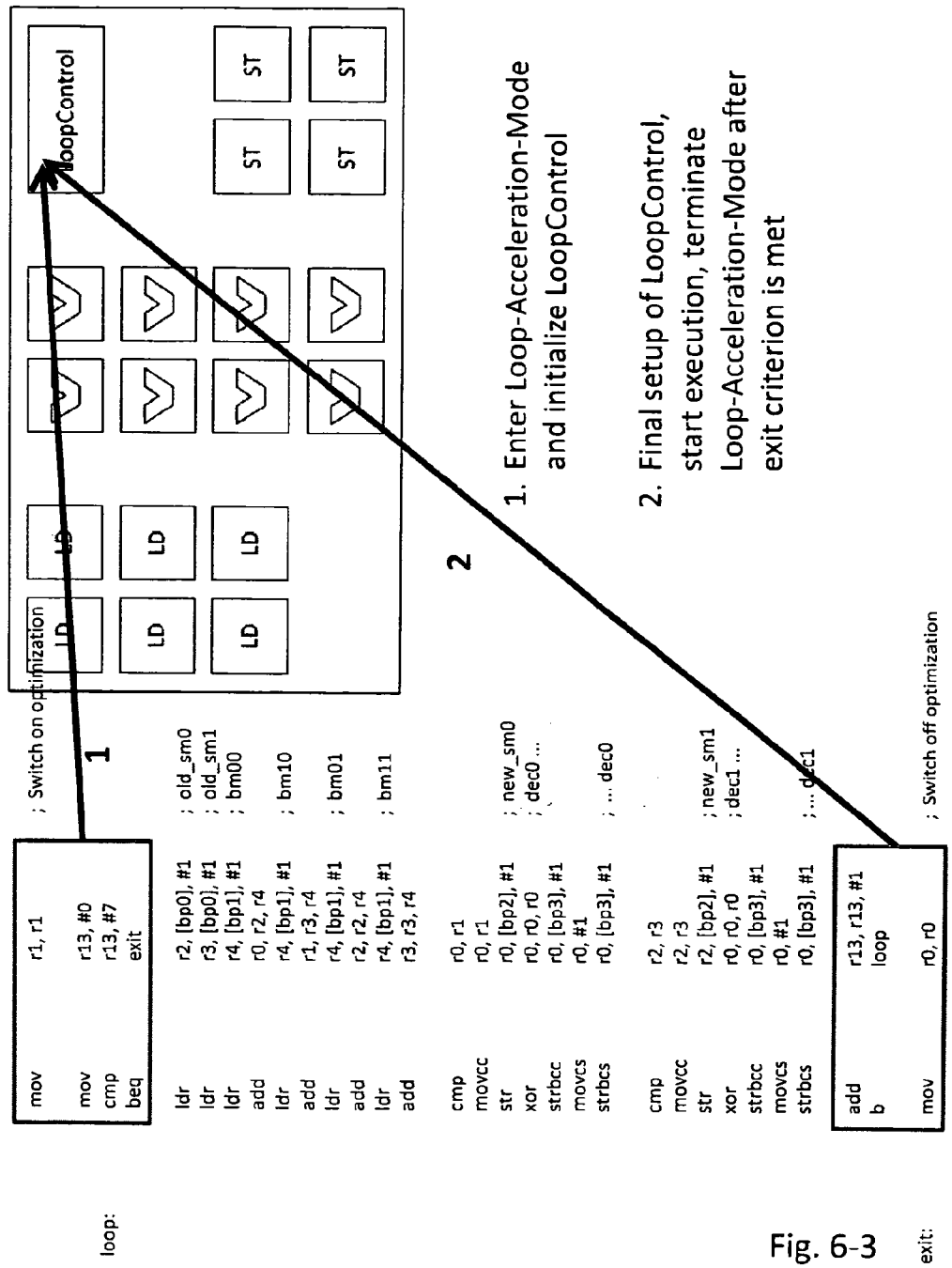
Figures 4, 6:
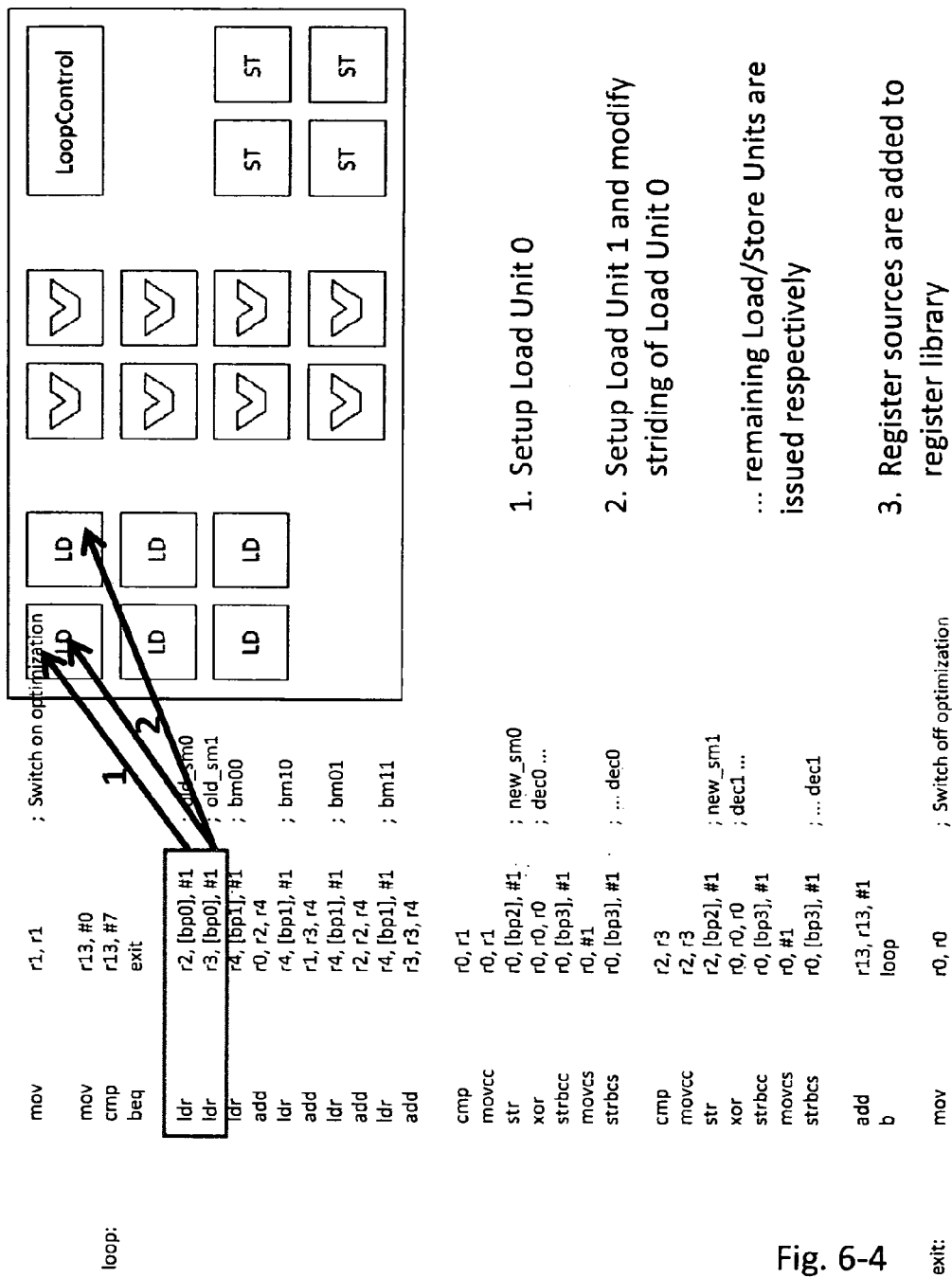
Figures 5, 6:
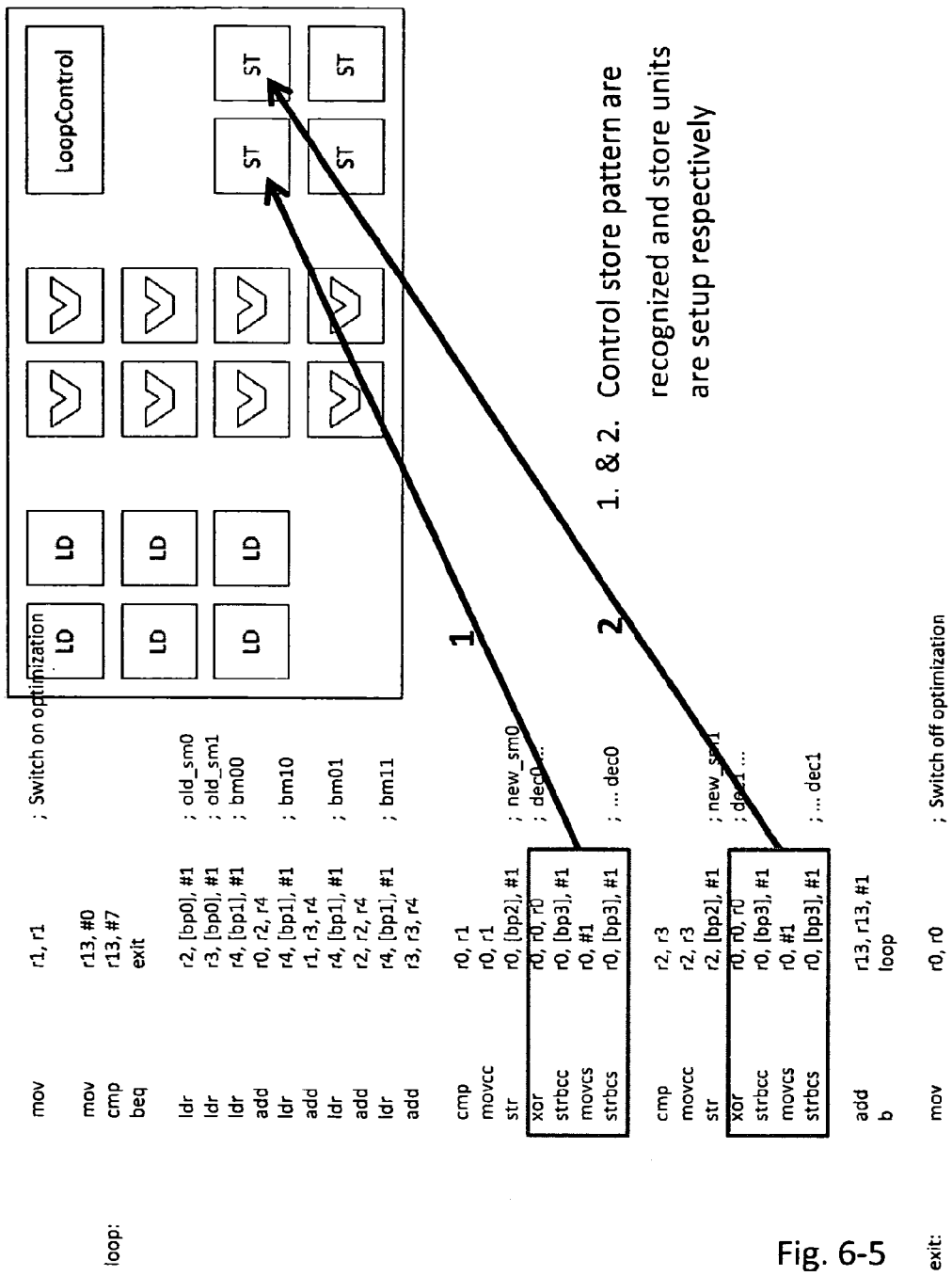
Figure 6:
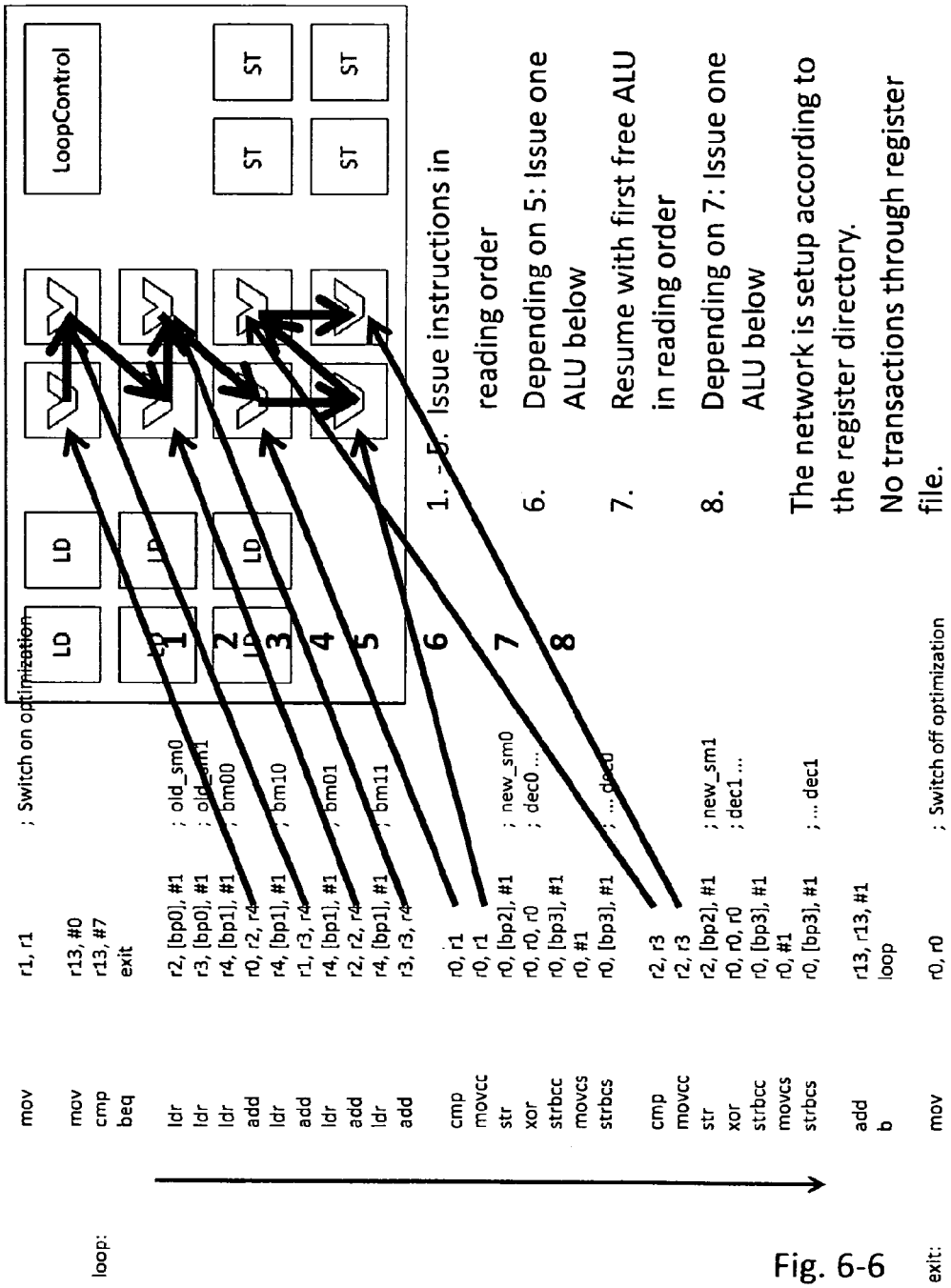

FIG. 6-1 shows an exemplary embodiment of a ZZYX core.

FIG. 6-2 shows an exemplary loop: The code is emitted by the compiler in a structure which is in compliance with the instruction decoder of the processor. The instruction decoder (e.g. the optimizer passes 0405 and/or 0410) recognizes code patterns and sequences; and (e.g. a rotor, see [4] FIG. 14 and/or [1] FIG. 17*a* and FIG. 17*b*) distributes the code accordingly to the function units (e.g. ALUs, control, Load/Store, etc) of the processor.

The code of the exemplary loop shown in FIGS. 6-2, 6-3, 6-4, 6-5, and 6-6 is also provided below for better readability:

|       | mov    | r1, r1       | ; Switch on optimization |
|-------|--------|--------------|--------------------------|
|       | mov    | r13, #0      |                          |
| loop: | cmp    | r13, #7      |                          |
|       | beq    | exit         |                          |
|       | ldr    | r2, [bp0], #1 | ; old_sm0               |
|       | ldr    | r3, [bp0], #1 | ; old_sm1               |
|       | ldr    | r4, [bp1], #1 | ; bm00                  |
|       | add    | r0, r2, r4   |                          |
|       | ldr    | r4, [bp1], #1 | ; bm10                  |
|       | add    | r1, r3, r4   |                          |
|       | ldr    | r4, [bp1], #1 | ; bm01                  |
|       | add    | r2, r2, r4   |                          |
|       | ldr    | r4, [bp1], #1 | ; bm11                  |
|       | add    | r3, r3, r4   |                          |
|       | cmp    | r0, r1       |                          |
|       | movcc  | r0, r1       |                          |
|       | str    | r0, [bp2], #1 | ; new_sm0               |
|       | xor    | r0, r0, r0   | ; dec0 ...               |
|       | strbcc | r0, [bp3], #1 |                         |
|       | movcs  | r0, #1       |                          |
|       | strbcs | r0, [bp3], #1 | ; ... dec0              |
|       | cmp    | r2, r3       |                          |
|       | movcc  | r2, r3       |                          |
|       | str    | r2, [bp2], #1 | ; new_sm1               |
|       | xor    | r0, r0, r0   | ; dec1 ...               |
|       | strbcc | r0, [bp3], #1 |                         |
|       | movcs  | r0, [bp3], #1 | ; ... dec1              |
|       | add    | r13, r13, #1 |                          |
|       | b      | loop         |                          |
| exit: | mov    | r0, r0       | ; Switch off optimization |

The listed code has the identical structure as in the Figures for easy referencing.

FIG. 6-3 shows the detection of the loop information (header and footer) and the respective setup of/microcode issue to the loop control unit. At the beginning of the loop the code pattern for the loop entry (e.g. header) is detected (1) and the respective instruction(s) are transferred to a loop control unit, managing loop execution. At the end of the loop the pattern of the according loop exit code (e.g. footer) is detected (1) and the respective instruction(s) are transferred to a loop control unit. For details on loop control reference is made to [1] in particular to "loop control" and "TCC".

The detection of the code pattern might be implemented in 0405 and/or 0410. In particular microcode fusion techniques might apply for fusing the plurality of instructions of the respective code patterns into (preferably) one microcode.

FIG. 6-4 shows the setup of/microcode issue to the Load Units in accordance with detected instructions. Each instruction is issued to a different load unit and can therefore be executed independently and in particular concurrently. As the second shown instruction (ldr r3, [bp0], #1) depends on the same base pointer (bp0) as the first shown instruction (ldr r2, [bp0], #1), the address calculation of the respective two pointers must be adjusted to compute correctly within a loop when independently calculated. For example: Both pointers increment by an offset of 1. If sequentially executed, however, both addresses, address of r2 and address of r3, would move in steps of 2, as the instructions add 2-times a value of 1. But, executed in parallel and in different load units, both addresses would only move in steps of 2. Therefore the offset of both instructions must be adjusted to 2 and furthermore the base address of the second instruction (ldr r3, [bp0], #1) must be adjusted by an offset of 1. Respectively when detecting and issuing the second instruction, the offset of the first must be adjusted (as shown by the second arrow of 2). Accordingly (but not shown) must the address generation of the other load and store instructions (e.g. relative to base pointers bp1, bp2 and bp3) be adjusted.

FIG. 6-5 shows the setup of/microcode issue to the Store units in accordance with detected instruction patterns and/or macros. The store units support complex store functions storing conditionally one of a set of immediate value depending on status signals (e.g. the processor status). The shown code stores either a zero value (xor r0, r0, r0) or a one (movcs r0, #1) to the address of base pointer bpi, depending on the current status. The conditional mnemonic-extensions 'cc' and 'cs' are respectively used. For details on the ARM instruction set see [13]. As described before, the instruction decoder (e.g. the optimizer passes 0405 and/or 0410) recognizes the code patterns and sequences, which might be fused and the joint information is transmitted (1 and 2) by a microcode to the store unit.

FIG. 6-6 shows the issue of the instructions dedicated to the ALUs. The instructions are issued according to their succession in the binary code. The issue sequence is such that first a row is filled and then issuing continues with the first column of the next lower row. If an instruction to be issued depends on a previously issued instruction such, that it must be located in a lower row for being capable of receiving required results from another ALU due to network limitations, it is accordingly placed (see FIG. 6-6 6). Yet, code issue continues afterwards with the higher available ALU. Consequently issue pointer moves up again (see FIG. 6-6 7). For details on code distribution reference is made to [1] and [4] (both incorporated by reference for full disclosure), e.g. a rotor, see [4] FIG. 14 and/or [1] FIG. 17a and FIG. 17b.

FIG. 6-7 shows an example of an enhanced instruction set providing optimized ZZYX instructions: Shown is the same loop code, but the complex code macros requiring fusion are replaced by instructions which were added to the ARM's instruction set:

The lsuld instruction loads bytes (lsuldb) or words (lsuldw) from memory. Complex address arithmetic is supported by the instruction, in which an immediate offset is added (+=offset) to a base pointer which might then be sequentially incremented by a specific value (^ value) with each processing cycle.

The lsust instruction stores bytes (lsustb) or words (lsustw) to memory. The address generation operates as for the lsuld instruction.

A for instruction defines loops, setting the start-, endvalues, and the step width; all in a single mnemonic. The endfor instruction respectively indicates the end of the loop code.

The code shown in FIG. 6-7 is also listed below for better readability:

```
lsuldw   r4, bp0 += ^1         ; old_sm0
lsuldw   r5, bp0 += ^1         ; old_sm1
lsuldw   r6, bp1 += 0 ^1*4     ; bm00
lsuldw   r7, bp1 += 1 ^1*4     ; bm10
lsuldw   r8, bp1 += 2 ^1*4     ; bm01
lsuldw   r9, bp1 += 3 ^1*4     ; bm11
lsustw   r0, bp2 += 0 ^2       ; new_sm0
lsustw   r2, bp2 += 1 ^2       ; new_sm1
lsustb   s0, bp3 += 0 ^2       ; dec0 (rss!)
lsustb   s1, bp3 += 1 ^2       ; dec1 (rss!)
for      0,<=7,+1
   add   r0, r4, r6
   add   r1, r5, r7
   add   r2, r4, r8
   add   r3, r5, r9
   cmp   r0, r1
   cmp   r2, r3
   movle r0, r1
   movle r2, r3
endfor
```

The listed code has the identical structure as in the Figure for easy referencing.

LITERATURE AND PATENTS OR PATENT APPLICATIONS INCORPORATED BY REFERENCE

The following references are incorporated by reference into the patent for complete disclosure. It is expressively noted, that claims may comprise elements of any reference embodied into the specification:

[1] ZZYX07: PCT/EP 2009/007415 (WO2010/043401); Vorbach

[2] ZZYX08: PCT/EP 2010/003459 (WO2010/142432); Vorbach

[3] ZZYX09: PCT/EP 2010/007950; Vorbach

[4] ZZYX10: PCT/EP 2011/003428; Vorbach

[5] ZZYX11: DE 11 006 698.2; Vorbach

[6] http://www.videolan.org/developers/x264.html: VideoLAN, VLC media player and x264 are trademarks registered (or in registration process) by the VideoLAN non-profit organization. Software are licensed under the GNU General License.

[7] PACT04: U.S. Pat. No. 7,028,107; Vorbach et al

[8] PACT10: U.S. Pat. No. 6,990,555; Vorbach et al

[9] PACT08: U.S. Pat. No. 7,036,036; Vorbach et al.

[10] The unabridged Pentium 4; IA32 Processor Genealogy; Tom Shanley; Mindshare Inc.; ISBN0-321-25656-X

[11] Trace Cache: a Low Latency Approach to High Bandwidth Instruction Fetching; Eric Rotenberg Computer Science Dept. Univ. of Wisconsin, Steve Bennett Intel Corporation, James E. Smith Dept. of Elec. and Comp. Engr. Univ. of Wisconsin; Copyright 1996 IEEE. Published in the Proceedings of the 29th Annual International Symposium on Microarchitecture, Dec. 2-4, 1996, Paris, France.

[12] U.S. Pat. No. 5,381,533; Peleg et al (DYNAMIC FLOW INSTRUCTION CACHE MEMORY ORGANIZED AROUND TRACE SEGMENTS INDEPENDENT OF VIRTUAL ADDRESS LINE)

[13] ARM Architecture Reference Manual; Copyright © 1996-1998, 2000, 2004, 2005 ARM Limited. All rights reserved. ARM DDI 01001

APPENDIX A

```
0000007c <x264_encoder_delayed_frames>:
0000007c:   e92d40f8    push    {r3, r4, r5, r6, r7, lr}
0000007e:   e59f3114    ldr     r3, [pc,#276]            ; (194
                <x264_encoder_delayed_frames+0x118>)
00000080:   e2904000    adds    r4; r0, #0
00000082:   e7900003    ldr     r0, [r0, r3]
00000084:   e3500001    cmp     r0, #1
00000086:   ca000000    bgt.n   8a <x264_encoder_delayed_frames+0xe>
00000088:   ea000082    b.n     190
                <x264_encoder_delayed_frames+0x114>
0000008a:   e3b030aa    movs    r3, #170                 ;0xaa
0000008c:   e1b05103    lsls    r5, r3, #2
0000008e:   e1b00100    lsls    r0, r0, #2
00000090:   e2506004    subs    r6, r0, #4
00000092:   e0947005    adds    r7, r4, r5
00000094:   e1b01e06    lsls    r1, r6, #28
00000096:   e59f2100    ldr     r2, [pc, #256]           ; (198
                <x264_encoder_delayed_frames+0x11c>)
00000098:   e5976000    ldr     r6, [r7, #0]
0000009a:   e3b03004    movs    r3, #4
0000009c:   e1b0lf21    lsrs    r1, r1, #30
0000009e:   e7965002    ldr     r5, [r6, r2]
000000a0:   e1530000    cmp     r3, r0
000000a2:   0a00003d    beq.n   120
                <x264_encoder_delayed_frames+0xa4>
000000a4:   e3510000    cmp     r1, #0
000000a6:   0a00001c    beq.n   e2 <x264_encoder_delayed_frames+0x66>
000000a8:   e3510001    cmp     r1, #1
000000aa:   0a000010    beq.n   ce <x264_encoder_delayed_frames+0x52>
000000ac:   e3510002    cmp     r1, #2
000000ae:   0a000006    beq.n   be <x264_encoder_delayed_frames+0x42>
000000b0:   e3b060ab    movs    r6, #171                 ; 0xab
000000b2:   e1b01106    lsls    r1, r6, #2
000000b4:   e0947001    adds    r7, r4, r1
000000b6:   e5973000    ldr     r3, [r7, #0]
000000b8:   e7936002    ldr     r6, [r3, r2]
000000ba:   e3b03008    movs    r3, #8
000000bc:   e0955006    adds    r5, r5, r6
000000be:   e3b070aa    movs    r7, #170                 ; 0xaa
000000c0:   e0941003    adds    r1, r4, r3
000000c2:   e1b06107    lsls    r6, r7, #2
000000c4:   e0917006    adds    r7, r1, r6
000000c6:   e5971000    ldr     r1, [r7, #0]
000000c8:   e2933004    adds    r3, #4
000000ca:   e7917002    ldr     r7, [r1, r2]
000000cc:   e0955007    adds    r5, r5, r7
000000ce:   e3b010aa    movs    r1, #170                 ; 0xaa
000000d0:   e0946003    adds    r6, r4, r3
000000d2:   e1b07101    lsls    r7, r1, #2
000000d4:   e0961007    adds    r1, r6, r7
000000d6:   e5916000    ldr     r6, [r1, #0]
000000d8:   e2933004    adds    r3, #4
000000da:   e7961002    ldr     r1, [r6, r2]
000000dc:   e0955001    adds    r5, r5, r1
000000de:   e1530000    cmp     r3, r0
000000e0:   0a00001e    beq.n   120
                <x264_encoder_delayed_frames+0xa4>
000000e2:   e3b070aa    movs    r7, #170                 ; 0xaa
000000e4:   e0941003    adds    r1, r4, r3
000000e6:   e1b06107    lsls    r6, r7, #2
000000e8:   e0917006    adds    r7, r1, r6
000000ea:   e5976000    ldr     r6, [r7, #0]
000000ec:   e3b070aa    movs    r7, #170                 ; 0xaa
000000ee:   e7961002    ldr     r1, [r6, r2]
000000f0:   e1b07107    lsls    r7, r7, #2
000000f2:   e0955001    adds    r5, r5, r1
000000f4:   e2931004    adds    r1, r3, #4
000000f6:   e0946001    adds    r6, r4, r1
000000f8:   e0966007    adds    r6, r6, r7
000000fa:   e5966000    ldr     r6, [r6, #0]
000000fc:   e0941001    adds    r1, r4, r1
000000fe:   e7966002    ldr     r6, [r6, r2]
00000100:   e297700c    adds    r7, #12
00000102:   e0955006    adds    r5, r5, r6
00000104:   e3b060ab    movs    r6, #171                 ; 0xab
00000106:   e1b06106    lsls    r6, r6, #2
00000108:   e0911006    adds    r1, r1, r6
0000010a:   e5911000    ldr     r1, [r1, #0l
```

-continued

```
0000010c:  e7916002  ldr    r6, [r1, T2]
0000010e:  e0941003  adds   r1, r4, r3
00000110:  e0955006  adds   r5, r5, r6
00000112:  e0916007  adds   r6, r1, r7
00000114:  e5961000  ldr    r1, [r6, #0]
00000116:  e2933010  adds   r3, #16
00000118:  e7917002  ldr    r7, [r1, r2]
0000011a:  e0955007  adds   r5, r5, r7
0000011c:  e1530000  cmp    r3, r0
0000011e:  1affffe0  bne.n  e2 <x264_encoder_delayed_frames+0x66>
00000120:  e3b01096  movs   r1, #150                ; 0x96
00000122:  e1b03181  lsls   r3, r1, #3
00000124:  e7942003  ldr    r2, [r4, r3]
00000126:  e29220aa  adds   r2, #170                ; 0xaa
00000128:  e1b00102  lsls   r0, r2, #2
0000012a:  e7904004  ldr    r4, [r0, r4]
0000012c:  e59f706c  ldr    r7, [pc, #108]          ; (19c <x264_encoder_delayed_frames+0x120>)
0000012e:  e7943007  ldr    r3, [r4, r7]
00000130:  e5936000  ldr    r6, [r3, #0]
00000132:  e3560000  cmp    r6, #0
00000134:  0a000004  beq.n  140 <x264_encoder_delayed_frames+0xc4>
00000136:  e2933004  adds   r3, #4
00000138:  e8b30001  ldmia  r3,, +55r0+56
0000013a:  e2955001  adds   r5, #1
0000013c:  e3500000  cmp    r0, #0
0000013e:  1afffffb  bne.n  138 <x264_encoder_delayed_frames+0xbc>
00000140:  e59f605c  ldr    r6, [pc, #92]           ; (1a0 <x264_encoder_delayed_frames+0x124>)
00000142:  e7940006  ldr    r0, [r4, r6]
00000144:  e2900035  adds   r0, #53                 ; 0x35
00000146:  e29000ff  adds   r0, #255                ; 0xff
00000148:  ebfffffe  bl     0 <pthread_mutex_lock>
0000014c:  e7940006  ldr    r0, [r4, r6]
0000014e:  e2900024  adds   r0, #36                 ; 0x24
00000150:  ebfffffe  bl     0 <pthread_mutex_lock>
00000154:  e7940006  ldr    r0, [r4, r6]
00000156:  e29000ac  adds   r0, #172                ; 0xac
00000158:  ebfffffe  bl     0 <pthread_mutex_lock>
0000015c:  e7940006  ldr    r0, [r4, r6]
0000015e:  e3b020a8  movs   r2, #168                ; 0xa8
00000160:  e7901002  ldr    r1, [r0, r2]
00000162:  e5907020  ldr    r7, [r0, #32]
00000164:  e3b03098  movs   r3, #152                ; 0x98
00000166:  e0912007  adds   r2, r1, r7
00000168:  e1b07083  lsls   r7, r3, #1
0000016a:  e7901007  ldr    r1, [r0, r7]
0000016c:  e29000ac  adds   r0, #172                ; 0xac
0000016e:  e0923001  adds   r3, r2, r1
00000170:  e0935005  adds   r5, r3, r5
00000172:  ebfffffe  bl     0 <pthread_mutex_unlock>
00000176:  e7940006  ldr    r0, [r4, r6]
00000178:  e2900024  adds   r0, #36                 ; 0x24
0000017a:  ebfffffe  bl     0 <pthread_mutex_unlock>
0000017e:  e7940006  ldr    r0, [r4, r6]
00000180:  e2900035  adds   r0, #53                 ; 0x35
00000182:  e29000ff  adds   r0, #255                ; 0xff
00000184:  ebfffffe  bl     0 <pthread_mutex_unlock>
00000188:  e2950000  adds   r0, r5, #0
0000018a:  e8bd00f8  pop    {r3, r4, r5, r6, r7}
0000018c:  e8bd0002  pop    ir1)
0000018e:  e12fff11  bx     r1
00000190:  e3b05000  movs   r5, #0
00000192:  eaffffcb  b.n    12c <x264_encoder_delayed_frames+0xb0>
00000194:  00000504  .word  0x00000504
00000198:  000004ac  .word  0x000004ac
0000019c:  00003ae0  .word  0x00003ae0
000001a0:  00007d20  .word  0x00007d20
```

The invention claimed is:

1. A method for generating hardware by compiling high-level software code, the method comprising:
grouping, by a system, software instructions into groups, wherein grouping the software instructions includes detecting instruction patterns and sequences in the software instructions;
transforming, by the system, the groups of software instructions into a hardware description language describing respective hardware blocks, wherein the hardware blocks are hardware representations of the respective groups of software instructions and provide one or more hardware functions for one or more target algorithms described by the groups of software instructions; and
generating, by the system, a main module interconnecting and controlling the hardware blocks,
wherein the main module includes:
i) a register file configured to store data received from the hardware blocks, and
ii) a decoder configured to select, for each currently active hardware block, a next hardware block to become active based on pointer information received from the currently active hardware block, and
wherein each of the hardware blocks is configured to:
receive input data from the register file,
transmit result data to the register file, and
generate the pointer information for the main module.

2. The method according to claim 1, wherein the hardware blocks are combined into hardware modules, the hardware modules comprising registers.

3. The method according to claim 2, wherein the main module uses input multiplexers in front of each hardware module to select the source of the input data according to received execution control signals.

4. The method according to claim 1, wherein a last instruction implemented in at least one of the hardware blocks is used to generate the pointer information, wherein the last instruction is a jump operation or call operation.

5. The method according to claim 1, wherein the groups of software instructions are transformed into synthesizable code in the hardware description language.

6. The method according to claim 1, wherein the groups of software instructions are transformed into a gate netlist in the hardware description language.

7. The method according to claim 1, wherein the hardware blocks are interconnected based on an order of execution of the software instructions represented in the hardware blocks.

8. The method according to claim 1, wherein the software instructions do not specify the hardware blocks and interconnection of the hardware blocks.

* * * * *